United States Patent
Reber et al.

(10) Patent No.: US 9,683,289 B2
(45) Date of Patent: Jun. 20, 2017

(54) DEVICE AND METHOD FOR CONTINUOUS CHEMICAL VAPOUR DEPOSITION UNDER ATMOSPHERIC PRESSURE AND USE THEREOF

(71) Applicant: Fraunhofer-Gesellschaft Zur Förderung Der Angewandten Forschung E.V., München (DE)

(72) Inventors: Stefan Reber, Gundelfingen (DE); Albert Hurrle, Waldkirch (DE); Norbert Schillinger, Ihringen (DE)

(73) Assignee: Fraunhofer-Gesellschaft Zur Förderung Der Angewandten Forschung E.V., München (DE)

( * ) Notice: Subject to any disclaimer, the term of this patent is extended or adjusted under 35 U.S.C. 154(b) by 453 days.

(21) Appl. No.: 14/488,750

(22) Filed: Sep. 17, 2014

(65) Prior Publication Data
US 2015/0037500 A1    Feb. 5, 2015

Related U.S. Application Data

(62) Division of application No. 12/067,233, filed as application No. PCT/EP2006/009228 on Sep. 22, 2006, now Pat. No. 8,900,368.

(30) Foreign Application Priority Data
Sep. 23, 2005  (DE) .................. 10 2005 045 582

(51) Int. Cl.
*C23C 16/44*   (2006.01)
*C23C 16/455*  (2006.01)
(Continued)

(52) U.S. Cl.
CPC ...... *C23C 16/4405* (2013.01); *C23C 16/4401* (2013.01); *C23C 16/4412* (2013.01);
(Continued)

(58) Field of Classification Search
CPC ..... C23C 16/54; C23C 16/545; C23C 16/455; C23C 16/45502; C23C 16/45563;
(Continued)

(56) References Cited

U.S. PATENT DOCUMENTS 3,367,304 A  2/1968 Williams
3,790,404 A  2/1974 Garnache et al.
(Continued)

FOREIGN PATENT DOCUMENTS

EP  0378815 A2  7/1990
EP  0545542 A1  6/1993
(Continued)

OTHER PUBLICATIONS

International Search Report for International Application PCT/EP2006/009228, dated Apr. 10, 2007.
(Continued)

*Primary Examiner* — Jeffrie R Lund
(74) *Attorney, Agent, or Firm* — Matthew B. Dernier, Esq.

(57) ABSTRACT

A device and a method for continuous chemical vapor deposition under atmospheric pressure on substrates. The device is hereby based on a reaction chamber, along the open sides of which the substrates are guided, as a result of which the corresponding coatings can be effected on the side of the substrates which is orientated towards the chamber interior.

17 Claims, 6 Drawing Sheets

(51) Int. Cl.
*C23C 16/453* (2006.01)
*C23C 16/458* (2006.01)
*C23C 16/54* (2006.01)

(52) U.S. Cl.
CPC .......... *C23C 16/453* (2013.01); *C23C 16/455* (2013.01); *C23C 16/4583* (2013.01); *C23C 16/45502* (2013.01); *C23C 16/45563* (2013.01); *C23C 16/45574* (2013.01); *C23C 16/54* (2013.01); *C23C 16/545* (2013.01)

(58) Field of Classification Search
CPC ............ C23C 16/4583; C23C 16/4401; C23C 16/4405; C23C 16/45574; C23C 16/453; C23C 16/4412
USPC ............ 118/715, 718, 719, 733; 156/345.33, 156/345.31
See application file for complete search history.

(56) References Cited

U.S. PATENT DOCUMENTS

| | | | |
|---|---|---|---|
| 4,048,955 | A | 9/1977 | Anderson |
| 4,495,024 | A | 1/1985 | Bok |
| 4,587,002 | A | 5/1986 | Bok |
| 4,664,951 | A | 5/1987 | Doehler |
| 5,236,509 | A | 8/1993 | Sioshansi |
| 5,364,481 | A | 11/1994 | Sasaki et al. |
| 6,329,304 | B1 | 12/2001 | Kuznetsov et al. |
| 7,294,207 | B2 | 11/2007 | Strauch et al. |
| 8,900,368 | B2* | 12/2014 | Reber ................ C23C 16/4401 118/715 |
| 2004/0065255 | A1 | 4/2004 | Yang et al. |
| 2005/0074983 | A1 | 4/2005 | Shinriki et al. |
| 2005/0100664 | A1 | 5/2005 | Chang et al. |
| 2008/0317956 | A1 | 12/2008 | Reber et al. |
| 2015/0037500 | A1* | 2/2015 | Reber ................ C23C 16/4401 427/255.28 |

FOREIGN PATENT DOCUMENTS

| | | |
|---|---|---|
| EP | 1394283 A | 3/2004 |
| GB | 1328390 A | 8/1973 |
| JP | 52030794 A | 3/1977 |
| JP | 2263984 A | 10/1990 |
| JP | 6291349 A | 10/1994 |

OTHER PUBLICATIONS

Written Opinion for International Application PCT/EP2006/009228, Jul. 23, 2007.
"Crystalline sillicon think-film solar cells—recent results at Fraunhofer" by Reber S. et al., Solar Energy, Pergamon Press, BD. 77, Nr. 6 (Dec. 2004) Germany.
"High-Throughput Continuous CVD Reactor for Silicon Deposition" by A Hurrle et al. 19th Eurpoean Photovoltaic Solar Energy Conference, Jun. 7-11, 2005 Paris.
International Preliminary Report on Patentability and Written Opinion for PCT/EP2006/009228, Apr. 24, 2008.
E. Mesic et. al., "Numerical study of AlGaN growth by MOVPE in an AIX200 RF horizontal reactor" Computational Materials Science 31 (2004) 42-56.
Office Action for corresponding JP Application 2008-531617, dated Mar. 13, 2012.
Non-Final Rejection of U.S. Appl. No. 12/067,233, dated Apr. 2011.
Final Rejection of U.S. Appl. No. 12/067,233, dated Sep. 28, 2011.
Non-Final Rejection of U.S. Appl. No. 12/067,233, dated May 28, 2014.

* cited by examiner

DEVICE AND METHOD FOR CONTINUOUS CHEMICAL VAPOUR DEPOSITION UNDER ATMOSPHERIC PRESSURE AND USE THEREOF

CROSS REFERENCE TO RELATED APPLICATIONS

This application is a divisional of U.S. patent application Ser. No. 12/067,233, accorded a filing date of Jul. 15, 2008, which claims priority to International Patent Application No.: PCT/EP2006/009228, filed Sep. 22, 2006, which claims priority to German Patent Application No.: DE 10 2005 045 582.4, filed Sep. 23, 2005, the entire disclosures of which are hereby incorporated by reference.

BACKGROUND

The invention relates to a device and a method for continuous chemical vapour deposition under atmospheric pressure on substrates. The device is hereby based on a reaction chamber, along the open sides of which the substrates are guided, as a result of which the corresponding coatings can be effected on the side of the substrates which is orientated towards the chamber interior.

The production of thin layers made of gaseous starting materials (so-called precursors) is implemented with a large number of technical realisations. It is common to all methods that a gaseous precursor or a precursor brought into the gas phase is conducted into a reaction chamber, is decomposed there by the coupling in of energy and components of the gas are deposited on the parts to be coated. One of these methods is atmospheric pressure chemical vapour deposition (termed APCVD). It is characterised in that the precursor and the process chamber are almost at atmospheric pressure. An example of APCVD is APCVD epitaxy of silicon layers made of chlorosilanes. In this case the chlorosilane, normally mixed with hydrogen, is degraded in the reaction chamber at temperatures around 1000-1200° C. and silicon is deposited on a crystalline silicon substrate with the same crystal orientation. This process is used inter alia for solar cells which comprise thin, crystalline Si layers. In particular for this application case, silicon deposition reactors are required, which can deposit an approx. 10-20 μm thick Si layer very economically (under 30 €/m$^2$) and at a high throughput (>20 m$^2$/h). The reactors corresponding to the state of the art cannot achieve these requirements because they a) have too little throughput (e.g. ASM Epsilon 3000: 1 m$^2$/h) and b) use the silicon contained in the precursor only very incompletely (a few percent). A new development concerns the production of a high throughput reactor for chemical vapour deposition/epitaxy of silicon (Hurrle, S. Reber, N. Schillinger, J. Haase, J. G. Reichart, "High Throughput Continuous CVD Reactor for Silicon Deposition", in Proc. 19$^{th}$ European Conference on Photovoltaic Energy Conversion (WIP—Munich, ETA—Florence 2004, p. 459). In addition to the deposition of silicon, also all other layers which can be deposited under atmospheric pressure are in principle thereby producible in this reactor.

The reactor embodies the following principle (see FIG. 1): 2 parallel rows of substrates 1, 1' are moved into a pipe 2 through a gas lock. In the interior of the pipe there is a chamber 3 which is open on the left and on the right. These openings of the chamber are also termed subsequently "deposition zone". One row of substrates respectively is moved past on an open side of the chamber, closes the opening and thereby seals the chamber volume relative to the pipe volume. The precursor is introduced into the chamber from the front (i.e. the side of the inlet gas lock) through a gas inlet 4 and is suctioned-off through a gas outlet 5 in the rear region of the chamber. A special feature of the deposition chamber is that, relative to the volume situated outside the chamber, a small low pressure is maintained. This prevents large quantities of process gas escaping from the chamber. At the above-mentioned temperatures, the precursor (here: SiHCl$_3$/H$_2$) is degraded and silicon is deposited principally on the continuously rearwardly-moving inner sides of the rows of substrates. The process gas mixture is preferably chosen such that the gas is completely depleted at the rear end of the chamber and no further deposition takes place. As a result, a deposition profile (i.e. a profile or a different deposition thickness) is produced naturally, which is however completely compensated for by the movement of the substrates. The substrates leave the unit at the rear end of the pipe again through a gas lock. A further feature of the reactor is that the substrates can be coated continuously at a uniform feed rate, i.e. a cycled operation which is complex to control is not required.

At the parts 6 of the chamber which are produced from graphite and also at other surfaces, undesired "parasitic" depositions are produced. These must be removed regularly in order that all the cross-sections are maintained and hence no disturbing flakes are formed. In addition to the chamber surfaces, for example also the gas inlet nozzle or the gas outlet opening is affected by parasitic depositions.

The described principle must scale-up in throughput to a plant suitable for the production of solar cells and also must optimise as far as possible the operating time of the plant, i.e. ensure an interruption-free permanent operation as far as possible. The present invention takes this requirement into account.

SUMMARY OF THE INVENTION

Starting herefrom, it was the object of the present invention to provide a deposition plant for chemical vapour deposition, with which the throughput can be significantly increased relative to the method known from prior art.

According to the invention, a device is provided for continuous chemical vapour deposition under atmospheric pressure on substrates, which has a reaction chamber open on two oppositely situated sides. The substrates to be coated can be transported along the open sides, as a result of which the reaction chamber is sealed. The reaction chamber is thereby constructed such that it has respectively a front- and rear-side wall or another sealing means relative to the transport direction of the substrates, which are connected via two oppositely situated side walls. It is essential for the present invention now that the side walls of the device according to the invention have respectively at least two inlets and outlets for process gases which are disposed alternatingly at least in regions in the transport direction of the substrates. As a result of the alternating arrangement of gas inlets and outlets, the gas flows pass through the device in the counter-flow principle. As a result, the formation of parasitic coatings in the device, i.e. at places which are not intended to be coated, can be minimised or entirely prevented. Interruption of the continuous operation is not required for this purpose, in contrast to the state of the art, as a result of which a significantly higher throughput is achievable.

The concept according to the invention is hereby based on the following approaches:

The number of rows of substrates which are transported in parallel through the device can be increased.

The length of the deposition zone is increased.

In the proceeding deposition operation, the formation of parasitic coatings can be prevented or parasitically coated surfaces can be cleaned during continuous operation.

These approaches can be achieved by the following measures:

By means of skilled arrangement of the gas inlets and gas outlets and also of the associated gas flow.

By means of skilled displacement of the reaction equilibrium present in the gas mixture.

The gas inlets and gas outlets are preferably disposed in the form of nozzles on the side walls.

In this variant, the gas inlet is disposed on a first side wall, whilst the gas outlet is disposed on the oppositely situated side wall. Consequently, the result is formation of a gas flow which extends essentially perpendicular to the transport direction. If these are now disposed alternately, the result is application of the counter-flow principle since the gas flows of the successive gas inlets or gas outlets extend in the opposite direction.

Preferably, the device has at least one gas inlet for the introduction of a precursor for deposition on the substrates. In a further preferred embodiment of the device according to the invention, this likewise has at least one gas inlet for introduction of an etching gas in order to eliminate parasitic depositions.

A second variant of the device according to the invention is based on the fact that the gas inlets and the gas outlets are configured in the form of pipes which extend perpendicular to the transport direction and have a plurality of nozzles which spread out over the length of the pipe. Hence a system is used here with at least one gas inlet pipe and one gas outlet pipe. The individual pipes are thereby disposed preferably in the form of blocks. A preferred variant thereby provides that one block comprises two gas inlet pipes with gas outlet pipes situated therebetween. The device can thereby have in total a large number of blocks of this type which are disposed sequentially in the transport direction. It is likewise possible that an additional gas inlet pipe is also disposed in the block for an etching gas.

As substrates to be coated, preferably silicon, ceramic, glass and/or composites thereof or layer systems are used.

According to the invention, a chemical vapour deposition reactor is also provided, which contains a heating furnace in which at least two devices which are disposed parallel to each other are disposed according to one of the preceding claims. A further chemical vapour deposition reactor likewise contains a heating furnace in which however the devices according to the invention are disposed sequentially.

According to the invention, a method for continuous chemical vapour deposition under atmospheric pressure on substrates is likewise provided, in which the device according to the invention is used. The gas supply is thereby controlled such that, during the deposition on the substrates, parasitic depositions in the device are prevented and/or removed at the same time.

Preferably, at least one precursor is supplied via at least one gas inlet and is deposited then on the substrates during the coating process. Gas is thereby suctioned out of the device via at least one gas outlet. The suctioning-off can thereby be effected preferably via a pump.

A preferred variant of the method according to the invention now provides that, by means of periodic change of the composition of the at least one supplied gas, parasitic depositions in the device can be prevented and/or removed during the deposition process. If parasitic depositions are to be removed, then preferably at least one etching gas is supplied in order to remove these. This is then effected via a gas inlet for at least one etching gas. It is hereby possible both that the etching gas is supplied via a separate gas inlet and that the etching gas and the precursor are supplied via the same gas inlets, which is then effected in a temporal cycle.

In the method according to the invention it is particularly preferred to supply the at least one precursor and the at least one etching gas to the device periodically alternating via different gas inlets. In addition, is it preferred that the at least one etching gas and the at least one precursor are chemically compatible with each other.

Preferably, the gas inlets in the side walls or the nozzles into the gas inlet should be positioned such that they are directed towards the substrates so that a gas flow can be produced in the direction of the substrates. In contrast, the gas inlets or the nozzles of the gas inlet pipes for the at least one etching gas should be directed towards the surfaces of the device with parasitic depositions so that the parasitic depositions on these components of the device can be etched back.

In addition, it is preferred that, in the previously described block-wise construction, different process gases are supplied within the device, so that different layers or layer compositions can be deposited on the substrates during transport of the latter.

The method according to the invention can be implemented according to two different variants. In a first variant, slots are present between the delimitations of the process chamber and the substrates, the dimension of which changes substantially at no time. As a result, both continuous transport of the substrates through the device is made possible (i.e. at no time is there standstill of the substrate) and a cycled transport, comprising a transport cycle and a stationary cycle. Emergence of process gases is prevented by a suitable purge gas control. Alternatively, also sliding seals can be used in order to achieve a seal between substrate and process chamber. However problems can occur with respect to such a seal at high temperature and with high purity requirements.

A second preferred embodiment provides that the width of the slots is changed periodically during the process and the substrates are transported in a pulsed manner through the device. During a deposition cycle, the substrates rest on the delimitations of the process chamber and seal the same in an adequately gas-tight manner. During a short transport cycle, the substrates are raised from the chamber, are further transported and placed down again. The gas emergence from the slots produced during the transport cycle is prevented by suitable purge gas control. This is effected as in the previously described variant in that the pressure in the chamber is lowered relative to the ambient pressure until an adequate purge gas flow is made possible or at least a flow to the exterior is prevented. The advantages of this second variant reside, on the one hand, in a higher tolerance relative to pressure- or flow variations and, on the other hand, in a lower-contamination deposition volume, e.g. with respect to the purge gas and the contamination entrained therewith.

The subject according to the invention is intended to be explained in more detail with reference to the subsequent examples without wishing to restrict the latter to the special embodiments represented here.

DETAILED DESCRIPTION OF THE INVENTION

Example 1

Figure 1:
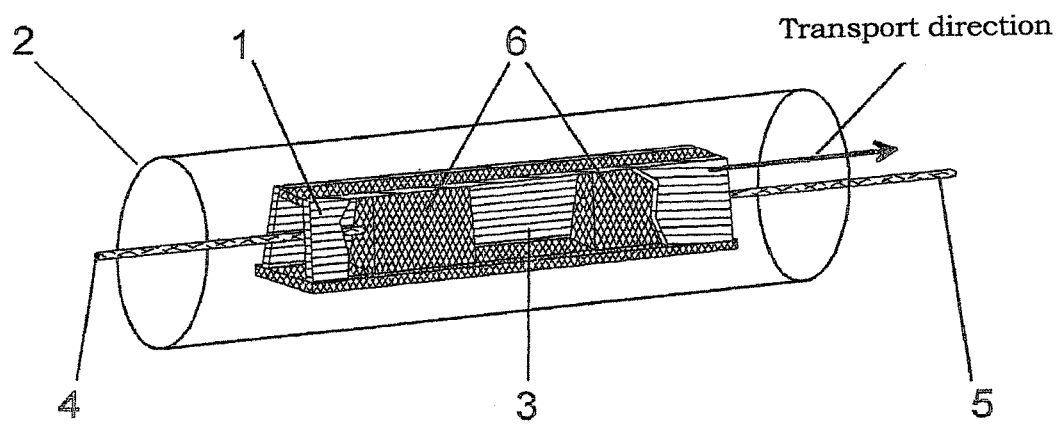
FIG. 1 shows a chemical vapour deposition reactor known from prior art.
Figure 2:
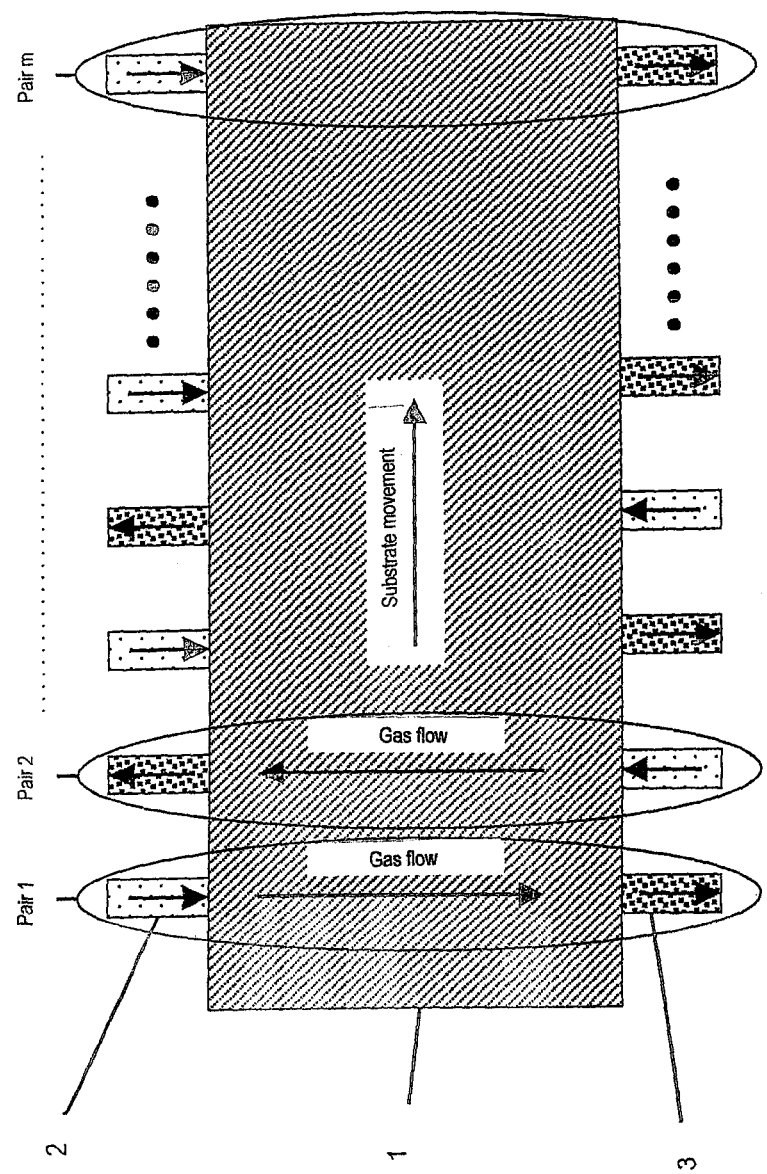
FIG. 2 shows a preferred embodiment of the device according to the invention with gas inlets and gas outlets alternating in the transport direction.

In a first preferred embodiment, the precursor in conveyed through inlet nozzles into the deposition chamber 1, said inlet nozzles being located on the longitudinal sides of the deposition chamber which is not formed by the substrates (see FIG. 2). One gas inlet 2 and gas outlet 3 respectively are situated approximately opposite each other, two successive pairs (e.g. pair 1 and pair 2 from FIG. 2) are disposed in mirror image. The gas flows of the successive pairs then run in counter-flow. According to the invention, the system is operated such that the precursor from the gas inlet to the gas outlet of one pair is used at a high percentage of the theoretically possible value, i.e. a profile is produced in which, because of gas depletion, almost no more deposition takes place at some point. Etching-back of parasitic layers takes place by using chemically compatible etching gas in one or more inlet pairs whilst the remaining pairs are still in the deposition operation. Alternatively, etching back can be achieved by changing the gas composition of the precursor (e.g. raising the Cl/H ratio in the case of chlorosilanes). The gas flow is changed during etching back such that the parasitically coated surfaces are preferably attacked and the layer to be used subsequently is saved as far as possible. At least the parasitically coated surface which is assigned to one pair of nozzles must thereby be etched back effectively. After conclusion of etching back, the pair of nozzles is again supplied with precursor for deposition and etching back begins again on a different pair of nozzles. This process is further continued periodically.

If it is advantageous for the process, the role of gas inlets and outlets can be exchanged periodically.

m pairs respectively form one deposition chamber.

Example 2

Figure 3:
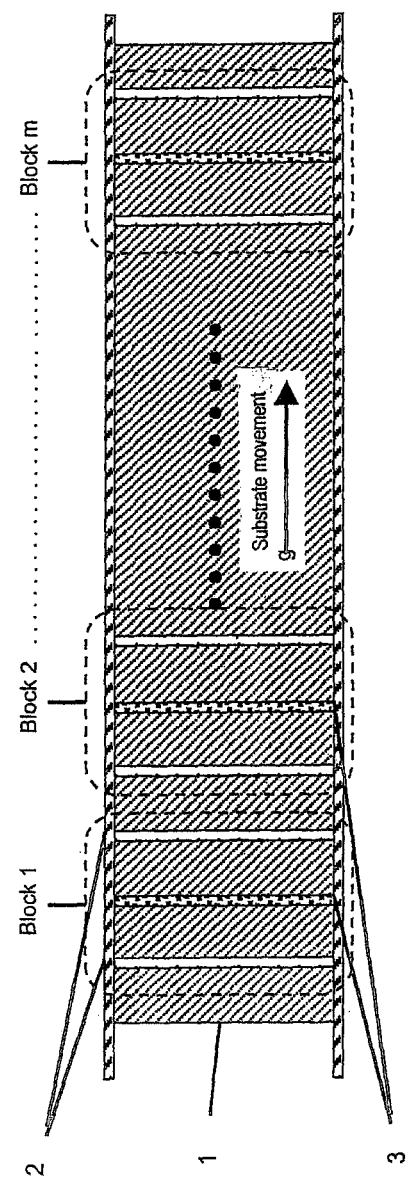
FIG. 3 shows an embodiment of the device according to the invention in which gas inlet pipes and gas outlet pipes which are disposed in blocks are used.
Figure 4:
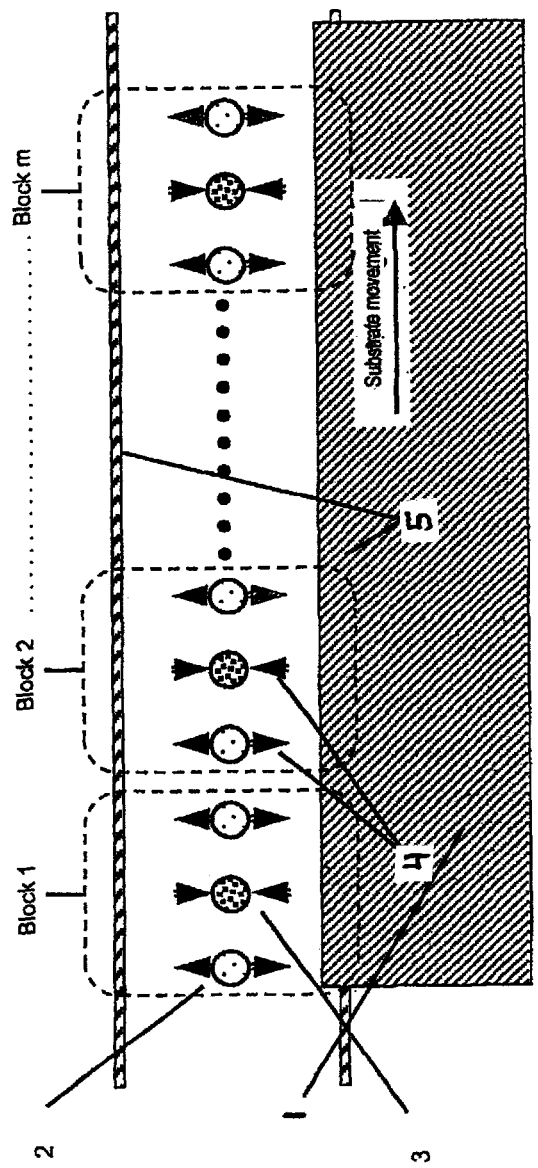
FIG. 4 shows the embodiment variant, which is represented in FIG. 3, in plan view.

A second form of the invention is characterised in the following: instead of an inlet-/or outlet nozzle at the side of the deposition chamber, gas inlet pipes with a plurality of inlet-/outlet nozzles which are distributed on the length of the pipe traverse the deposition chamber perpendicular to the direction of movement. A gas inlet pipe at the front and at the back respectively are assigned to one gas outlet pipe (see FIGS. 3 and 4). The gas is preferably blown out of the gas inlet pipes in the direction of the substrates. In the following, this arrangement is termed "block". During the deposition operation, precursor is introduced into both gas inlet pipes, the consumed gas is suctioned off by the gas outlet pipe therebetween. In the deposition chamber, any number of these blocks are disposed in succession. For etching back, one or more blocks is operated with etching gas which is chosen in its flow such that the parasitically coated surfaces are preferably gassed and hence etched back. Form 2 is extended as follows: instead of 2 gas inlet pipes per etching-back pipe respectively, the block is supplemented by additional gas inlet pipes in front of or behind the gas outlet pipe ("extended block"). Respectively m (extended blocks) form one deposition chamber.

Example 3

Figure 5:
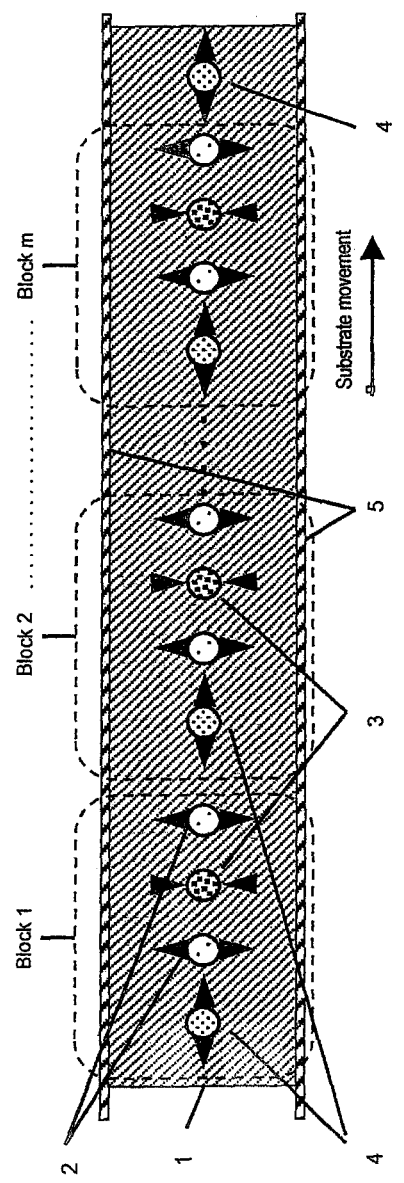
FIG. 5 shows a further embodiment of the device according to the invention with a block-wise arrangement of gas inlet pipes and gas outlet pipes and also additional etching-back pipes.
Figure 6:
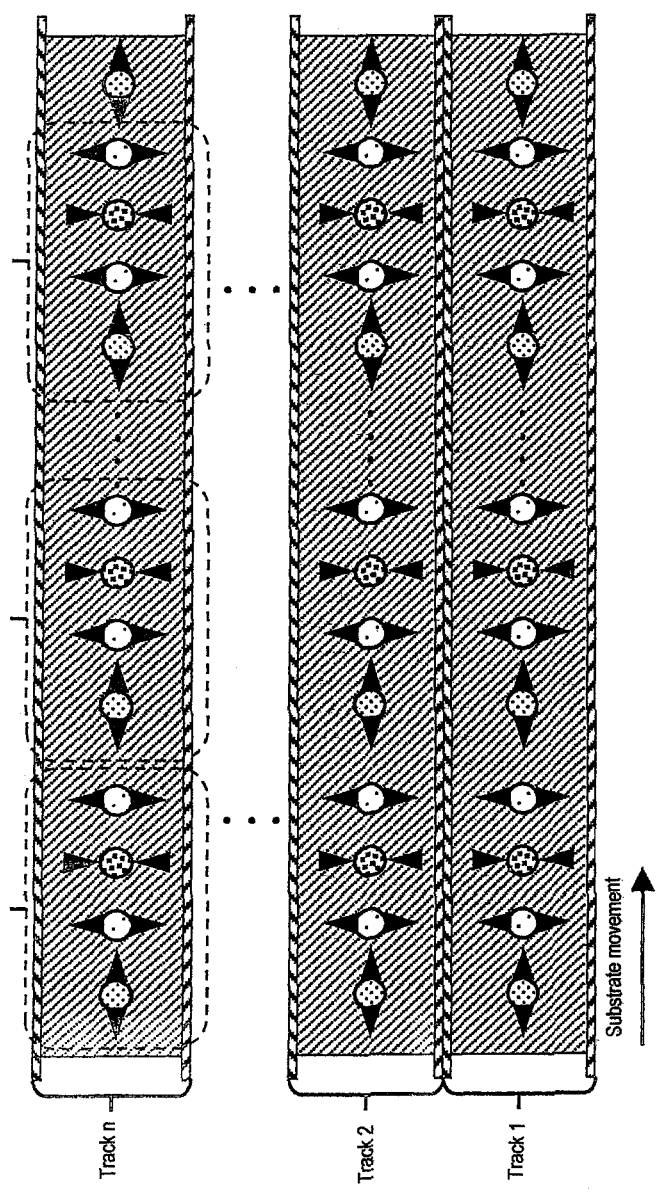
FIG. 6 shows an arrangement according to the invention in which a plurality of devices according to the invention and according to FIG. 5 are disposed parallel to each other.

In a third form, the block of form 2 is supplemented by a preceding, separate etching-back pipe (see FIG. 5). This etching-back pipe can be supplied with etching gas and etch back the respectively adjacent gas inlet- and outlet pipes. The direction of the etching gas flow is chosen such that the locations of the parasitic depositions are etched preferentially. Etching back can take place both in a cycle as in form 1 and 2 (i.e. the supply of precursor to the adjacent gas inlet pipes is interrupted during etching back) and in the proceeding deposition operation of all the gas inlet pipes. An essential feature of this operation is that the gas composition at the location of the gas inlet- and gas outlet pipes is changed by the etching gas such that the reaction equilibrium is displaced from deposition in the direction of etching. By means of direction and the quantity of etching gas, it is most extensively prevented that etching takes place on the substrate itself. Also the blocks of form 3 can be extended by additional gas inlet pipes, as in form 2. Respectively m of the blocks are disposed successively in series for one deposition chamber, an etching-back pipe after the $m^{th}$ block sealing a deposition chamber.

The invention claimed is:

1. A method for continuous chemical vapour deposition under atmospheric pressure on substrates, comprising:
providing a device containing a reaction chamber, the reaction chamber having:
front and rear side walls facing one another in an opposing spaced-apart configuration along a longitudinal axis,
first and second side walls coupled to the front and rear walls and facing one another in an opposing spaced-apart configuration along a first lateral axis, the first lateral axis being transverse to the longitudinal axis, such that the front, rear, first and second side walls define an interior volume of the reaction chamber,
first and second openings into the interior volume of the reaction chamber and being oriented in an opposing spaced-apart configuration along a second lateral axis, the second lateral axis being transverse to both the first lateral axis and the longitudinal axis, and
at least two pair of gas inlets/outlets, including: (i) a first gas inlet disposed through the first side wall, and a first gas outlet disposed through the second side wall, and (ii) a second gas inlet disposed through the second side wall, and a second gas outlet disposed through the first side wall;
transporting at least first and second substrates to be treated past the reaction chamber in a transport direction parallel to the longitudinal axis, such that the respective substrates temporarily close off the first and second openings, respectively, thereby defining a closed internal volume of the reaction chamber and receiving deposition gas via the at least two pair of gas inlets/outlets; and controlling a gas supply such that, during the deposition on the substrates, parasitic depositions in the device are prevented and/or removed at the same time.

2. The method according to claim 1, further comprising supplying at least one precursor via at least one of the gas inlets.

3. The method according to claim 1, further comprising suctioning gas out of the device via at least one of the gas outlets.

4. The method according to claim 3, wherein the suctioning-off is effected via a pump.

5. The method according to claim 1, wherein, by means of periodic change of a composition of the at least one supplied gas, parasitic depositions in the device are prevented and/or removed.

6. The method according to claim 1, further comprising removing parasitic depositions in the device by supplying at least one etching gas.

7. The method according to claim 6, wherein the at least one precursor and the at least one etching gas are supplied via the same gas inlets.

8. The method according to claim 6, further comprising supplying the at least one precursor and the at least one etching gas to the device periodically alternating via different gas inlets.

9. The method according to claim 6, wherein the at least one precursor and the at least one etching gas are chemically compatible with each other.

10. The method according to claim 1, further comprising supplying at least one etching gas for removing parasitic depositions via at least one of the gas inlets.

11. The method according to claim 10, further comprising supplying the at least one etching gas separately via at least one of the gas inlets.

12. The method according to claim 1, further comprising:
guiding a first gas flow from one of the gas inlets in the first side wall towards one of the gas outlets in the second side wall; and
guiding in parallel thereto a second gas flow from one of the gas inlets in the second side wall towards one of the gas outlets in the first side wall in a counter-flow principle.

13. The method according to claim 1, further comprising: directing the nozzles of the gas inlet pipes for the at least one precursor towards the substrates so that a gas flow is produced in the direction of the substrates.

14. The method according to claim 1, further comprising directing the nozzles of the gas inlet pipes for the at least one etching gas towards the surfaces of the device with parasitic depositions so that the parasitic depositions are etched back.

15. The method according to claim 1, further comprising supplying different process gases in each block so that different layers or layer compositions are deposited.

16. The method according to claim 1, further comprising providing slots between delimitations of the process chamber and the substrates, such that dimensions of the slots between the delimitations of the process chamber and the substrates do not change substantially temporally.

17. The method according to claim 1, further comprising providing slots between delimitations of the process chamber and the substrates, such that dimensions of the slots between the delimitations of the process chamber and the substrates change periodically.

* * * * *